(12) United States Patent
Tsai et al.

(10) Patent No.: US 6,436,841 B1
(45) Date of Patent: Aug. 20, 2002

(54) SELECTIVITY OXIDE-TO-OXYNITRIDE ETCH PROCESS USING A FLUORINE CONTAINING GAS, AN INERT GAS AND A WEAK OXIDANT

(75) Inventors: Ming Huan Tsai, Chupei; Bao-Ching Pen; Mei-Ru Kuo, both of Hsin-chu; Hun-Jan Tao, Hsinchu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/949,506

(22) Filed: Sep. 10, 2001

(51) Int. Cl.$^7$ ................ H01L 21/302; H01L 21/461
(52) U.S. Cl. ................ 438/738; 438/637; 438/740; 438/743; 216/72
(58) Field of Search ................ 438/637, 723, 438/700, 702, 735, 738, 740, 743, 233, 675, 672; 216/72, 80

(56) References Cited

U.S. PATENT DOCUMENTS

| 4,324,611 A | | 4/1982 | Vogel et al. ............ 156/643 |
| 5,302,236 A | | 4/1994 | Tahara et al. ............ 156/643 |
| 5,801,443 A | * | 9/1998 | Ohno ............ 257/750 |
| 6,063,711 A | | 5/2000 | Chao et al. ............ 438/724 |
| 6,074,908 A | | 6/2000 | Huang ............ 438/241 |
| 6,100,559 A | | 8/2000 | Park ............ 257/315 |
| 6,121,098 A | * | 9/2000 | Strobl ............ 438/233 |
| 6,140,224 A | * | 10/2000 | Lin ............ 438/627 |
| 6,190,957 B1 | * | 2/2001 | Mochizuki et al. ............ 438/240 |
| 6,214,721 B1 | | 4/2001 | Bendik, Jr. et al. ............ 438/624 |
| 6,297,162 B1 | * | 10/2001 | Jang et al. ............ 438/706 |
| 6,316,349 B1 | * | 11/2001 | Kim et al. ............ 257/401 |

* cited by examiner

Primary Examiner—Tuan H. Nguyen
Assistant Examiner—Thanhha Pham
(74) Attorney, Agent, or Firm—George O. Saile; Stephen B. Ackerman; Stephen G. Stanton

(57) ABSTRACT

A method of forming a borderless contact, comprising the following steps. A substrate having an exposed conductive structure is provided. An oxynitride etch stop layer is formed over the substrate and the exposed conductive structure. An oxide dielectric layer is formed over the oxynitride etch stop layer. The oxide dielectric layer is etched with an etch process having a high selectivity of oxide-to-oxynitride to form a contact hole therein exposing a portion of the oxynitride etch stop layer over at least a portion of the exposed conductive structure. The etch process not appreciably etching the oxynitride etch stop layer and including: a fluorine containing gas; an inert gas; and a weak oxidant. The exposed portion of the oxynitride etch stop layer over at least a portion of the conductive structure is removed. A borderless contact is formed within the contact hole. The borderless contact being in electrical connection with at least a portion of the conductive structure.

33 Claims, 2 Drawing Sheets

SELECTIVITY OXIDE-TO-OXYNITRIDE ETCH PROCESS USING A FLUORINE CONTAINING GAS, AN INERT GAS AND A WEAK OXIDANT

FIELD OF THE INVENTION

The present invention relates generally to semiconductor fabrication and more specifically to oxynitride etching processes.

BACKGROUND OF THE INVENTION

The incorporation of oxynitride (e.g. SiON) has proved to provide good integrated circuit (IC) semiconductor device performance. However, high etch selectivity of oxide (e.g. $SiO_2$) to oxynitride is more difficult to achieve than high etch selectivity of oxide to nitride (e.g. SiN).

U.S. Pat. No. 6,063,711 to Chao et al. describes an etch process with a high selectivity of silicon oxide to a silicon oxynitride etch stop.

U.S. Pat. No. 6,074,908 to Huang describes a borderless contact process with an etch stop.

U.S. Pat. No. 6,100,559 to Park describes a graded SiON cap layer that reduces the overall height of a layer stack and provides for increased process control during subsequent patterning of the layer stack.

U.S. Pat. No. 6,214,721 B1 to Bendik, Jr. et al. describes a "built-in" wave dampening, antireflective thin-film layer in a copper dual damascene film stack that reduces the standing wave intensity in the deep-UV (DUV) photoresist (PR).

U.S. Pat. No. 4,324,611 to Vogel et al. describes a process and gas mixture for etching silicon dioxide ($SiO_2$)) and/or silicon nitride (SiN) in a plasma environment in a planar reactor.

U.S. Pat. No. 5,302,236 to Tahara et al. describes a method of etching an oxide or nitride film on semiconductor wafer within a processing vessel using a $CHF_3$ etching plasma gas with CO gas present in the plasma atmosphere.

SUMMARY OF THE INVENTION

Accordingly, it is an object of an embodiment of the present invention to provide an etch process having an improved oxide to oxynitride selectivity.

Another object of an embodiment of the present invention is to provide an improved method of forming a borderless contact.

Other objects will appear hereinafter.

It has now been discovered that the above and other objects of the present invention may be accomplished in the following manner. Specifically, a substrate having an exposed conductive structure is provided. An oxynitride etch stop layer is formed over the substrate and the exposed conductive structure. An oxide dielectric layer is formed over the oxynitride etch stop layer. The oxide dielectric layer is etched with an etch process having a high selectivity of oxide-to-oxynitride to form a contact hole therein exposing a portion of the oxynitride etch stop layer over at least a portion of the exposed conductive structure. The etch process not appreciably etching the oxynitride etch stop layer and including: a fluorine containing gas; an inert gas; and a weak oxidant. The exposed portion of the oxynitride etch stop layer over at least a portion of the conductive structure is removed. A borderless contact is formed within the contact hole. The borderless contact being in electrical connection with at least a portion of the conductive structure.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
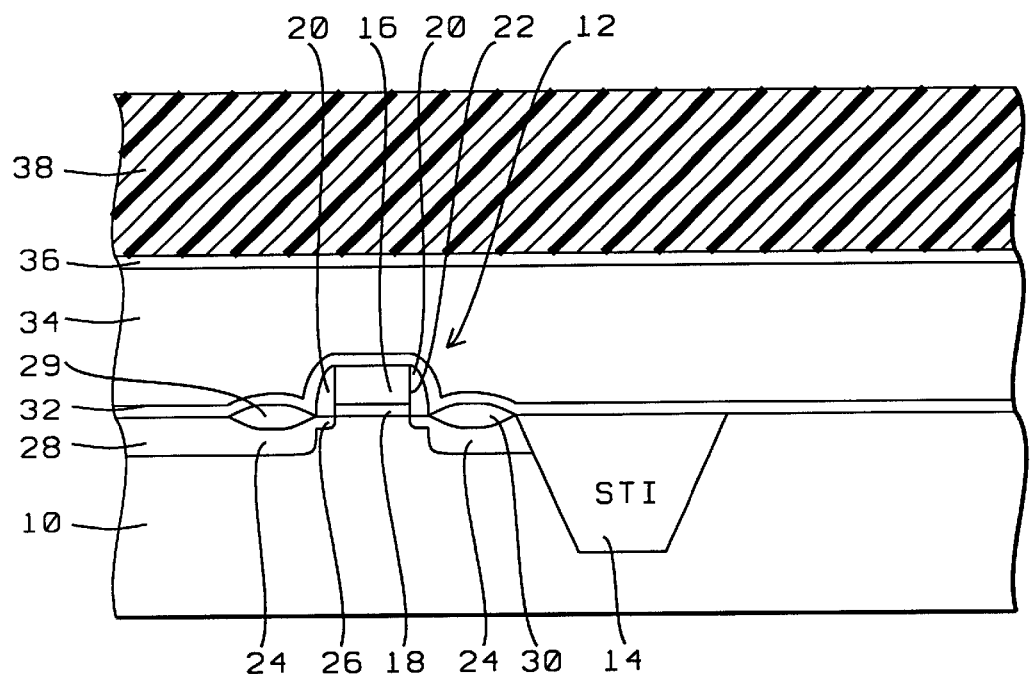
FIGS. 1 to 4 schematically illustrate a preferred embodiment of the present invention.

As shown in FIG. 1, substrate 10 has formed thereover a gate structure 12 proximate an oxide isolation structure 14 such as a shallow trench isolation (STI) as illustrated in FIG. 1. Substrate 10 is preferably a silicon semiconductor substrate.

Gate structure 12 includes a gate 16 formed over a gate oxide layer 18. Gate 16 has sidewall spacers 20 formed over its side walls 22. Source/drain implants 24 extend from gate 16 and include LDD 26 and HDD 28 implants. Silicide portions 29, 30 may be formed over S/D HDD implants 28 with silicide portion 30 proximate STI 14.

It is noted that any exposed conductive structure formed upon, over or within substrate 10 may substitute for the gate structure 12 with silicide portions 29, 30. It is only necessary that a conductive contact, in electrical contact with the conductive structure, be formed in an overlying dielectric oxide layer with an oxynitride etch stop layer formed between the conductive structure and the dielectric oxide layer.

An oxynitride layer 32 is formed over substrate 10 and acts as an etch stop layer. Oxynitride etch stop layer 32 is preferably comprised of silicon oxynitride (SiON) and has a thickness of preferably from about 100 to 1000 Å and more preferably from about 200 to 400 Å.

Inter-layer dielectric (ILD) 34 is formed over oxynitride etch stop layer 32 to a thickness of preferably from about 1000 to 10,000 Å and more preferably from about 3000 to 6000 Å. ILD layer 34 is preferably formed of oxide or silicon oxide and is more preferably formed of silicon oxide.

Anti-reflective coating (ARC) layer 36 is optionally formed over ILD layer 34 to a thickness of preferably from about 200 to 1000 Å. ARC layer 36 is preferably is an organic layer or a dielectric layer.

Masking layer 38 is then formed over ILD layer 34/optional ARC layer 36. Masking layer 38 is preferably comprised of photoresist or photoresist plus Si-containing polymer and is more preferably comprised of photoresist.

Patterning Masking Layer 38 to Form Mask Trench 40

Figure 2:
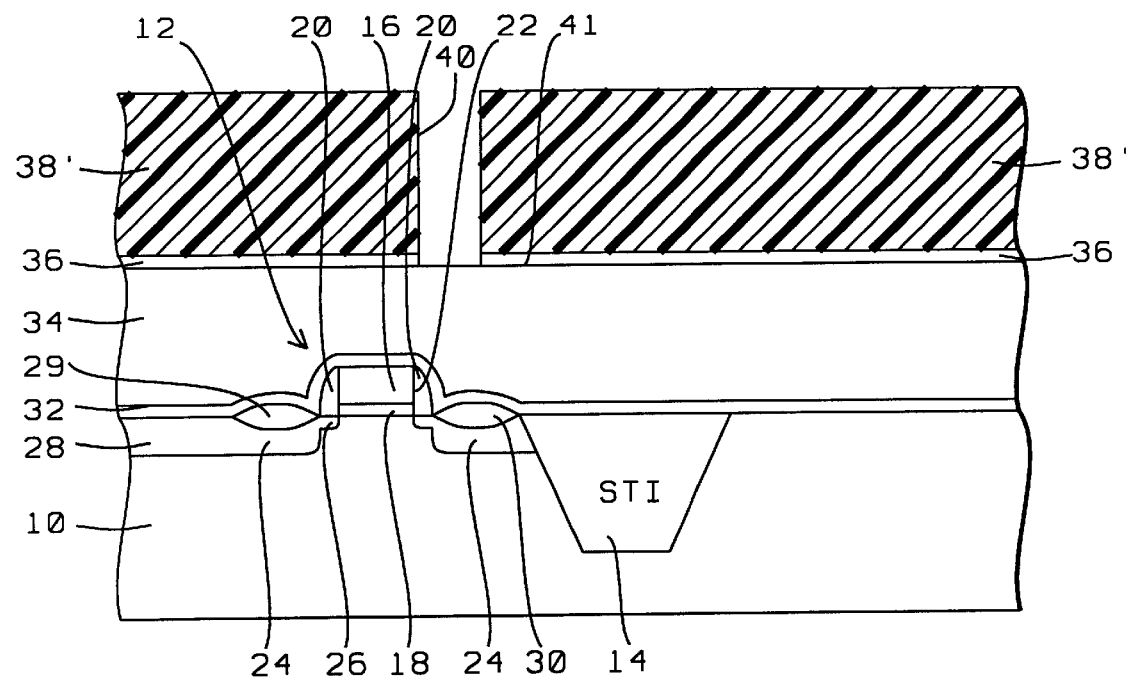

As shown in FIG. 2, masking layer 38 is patterned to form mask trench 40 to lead to achieving fabrication of a borderless contact 50 that will electrically contact the S/D silicide portion 30 proximate oxide STI 14. Optional ARC layer 36 is then patterned. This exposes a portion 41 of ILD layer 34 at least partially over the S/D silicide portion 30 proximate oxide STI 14.

Although such a borderless contact 50 should contact only the S/D silicide portion 30 proximate oxide STI 14, it is not uncommon for mask trench/contact hole 40 et al. to be misaligned and also expose a portion of oxide STI 14. Thus an ILD oxide layer 34 etch with a high selectivity of oxide (ILD layer 34) to oxynitride (etch stop layer 32) is required to avoid overetching into oxynitride etch stop layer 32, exposing oxide STI 14 and thus damaging STI 14 during the ILD layer 34 etch 42.

Key Step of the Invention—ILD Layer 34 Etch 42 With High Selectivity of Oxide to Oxynitride Etch to Form Contact Hole 44

Figure 3:
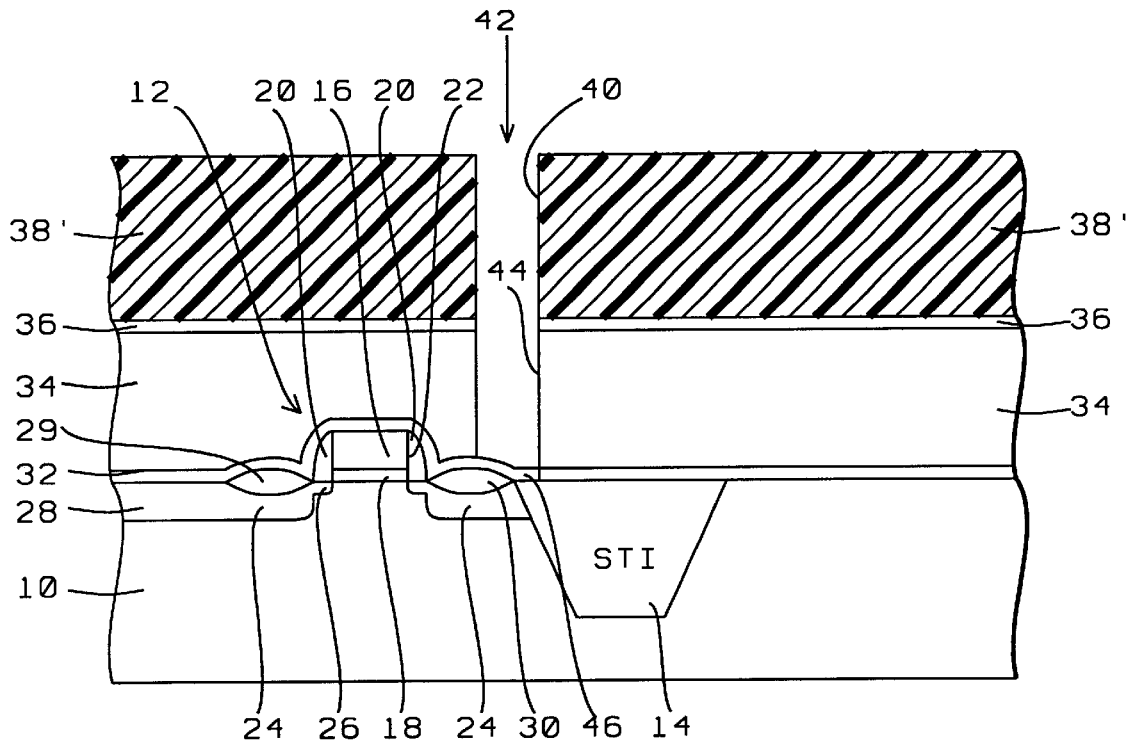

In a key step of the invention and as shown in FIG. 3, using patterning masking layer 38' the exposed portion 41 of oxide ILD layer 34 is etched using an etch 42 that has a high selectivity of oxide to oxynitride, i.e. oxide is etched at a much greater rate than oxynitride within the etching process 42, to form borderless contact hole 44 within ILD layer 34 exposing a portion 46 of SiON etch stop layer 32

The inventors have discovered an etch composition comprising:

a fluorine containing gas that is preferably $C_4F_8$, $C_5F_8$, $C_4F_6$, $C_3F_8$ or $C_3F_6$ is more preferably $C_4F_8$, $C_5F_8$ or $C_4F_6$ and is most preferably $C_5F_8$, an inert gas that is preferably argon (Ar), helium (He) or neon (Ne) is more preferably Ar or He and is most preferably Ar; and a weak oxidant that is preferably CO, $O_2$ or CO plus $O_2$.

The inert gas plays the role of a bombard source to improve gas dissociation and bombard out polymer or by-product on the bottom of the borderless contact hole as it is formed. Owing to the plasma by-product (carbon fluoride polymer) is it easier to get such deposits on oxynitride (the SiON stop layer 32) versus oxide (the ILD oxide layer 34) and thus the oxynitride film accumulates thicker polymer during etching 42 to shield it or protect it to a greater degree from the etch 42 ion bombardment than the oxide film. Thus the etch process 42 of the present invention achieves the necessary oxide-to-oxynitride selectivity. Specifically the oxide-to-oxynitride selectivity is preferably from about 5:1 to 50:1 and is more preferably from about 15:1 to 25:1.

The gas ratio, RF power (dual frequency can provide greater accuracy control) and the reactor temperature are key for controlling the dissociation and polymer (carbon fluoride polymer) deposition rate.

For example, (1) $C_4F_8$/CO/Ar; (2) $C_4F_6$/$O_2$/Ar; or (3) $C_5F_8$/CO/$O_2$/Ar may be used as etch 42 compositions at the following parameters:

(1) $C_4F_8$/CO/Ar etch 42 composition:
Total pressure: from about 1 to 1000 mTorr;
Top RF power: from about 500 to 5000 watts;
Bottom RF power: from about 500 to 5000 watts;
Reactor temp. from about −30 to 60° C.;
$C_4F_8$ gas flow: from about 5 to 50 sccm;
CO gas flow: from about 50 to 1000 sccm; and
Ar gas flow: from about 50 to 1000 sccm.

(2) $C_4F_8$/$O_2$/Ar etch 42 composition:
Total pressure: from about 1 to 1000 mTorr;
Top RF power: from about 500 to 5000 watts;
Bottom RF power: from about 500 to 5000 watts;
Reactor temp. from about −30 to 60° C.;
$C_4F_8$ gas flow: from about 5 to 50 sccm;
$O_2$ gas flow: from about 2 to 50 sccm; and
Ar gas flow: from about 50 to 1000 sccm.

(3) $C_5F_8$/CO/$O_2$/Ar etch 42 composition:
Total pressure: from about 1 to 1000 mTorr;
Top RF power: from about 500 to 5000 watts;
Bottom RF power: from about 500 to 5000 watts;
Reactor temp. from about −30 to 60° C.;
$C_5F_8$ gas flow: from about 5 to 50 sccm;
CO gas flow: from about 50 to 1000 sccm;
$O_2$ gas flow: from about 2 to 50 sccm; and
Ar gas flow: from about 50 to 1000 sccm.

Generally for etch 42 composition:
Total pressure: from about 1 to 1000 mTorr;
Top RF power: from about 500 to 5000 watts;
Bottom RF power: from about 500 to 5000 watts;
Reactor temp. from about −30 to 60° C.;
$C_xF_y$ gas flow: from about 5 to 50 sccm;
CO gas flow: from about 50 to 1000 sccm;
$O_2$ gas flow: from about 2 to 50 sccm;
Ar gas flow: from about 50 to 1000 sccm; and
He gas flow: from about 50 to 1000 sccm.

Etch process 42 is conducted in an oxide etcher such as a reactive ion etch (RIE) etcher, a magnetically enhanced reactive ion etch (MEIRE) etcher, an inductively coupled plasma (ICP) etcher or a dual frequency capacitance coupled plasma (CCP) etcher, for example.

As is known in the art, etch 42 continues until SiON from SiON etch stop layer 32 is detected.

Formation of Borderless Contact 50

Figure 4:
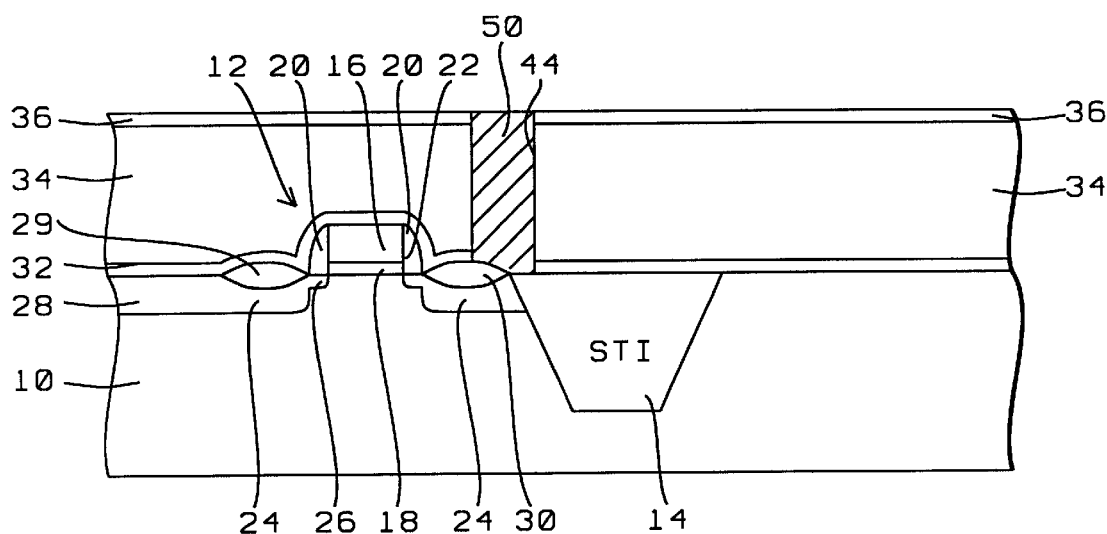

As shown in FIG. 4, masking layer 38 is removed and then the exposed portion 46 of SiON etch stop layer 32 is removed to expose a portion of silicide portion 30 and a portion of STI 14 (due to the misalignment of borderless contact hole 40). Organic ARC 36 is removed simultaneously with masking layer 38 while dielectric ARC 36 is sometimes fully removed simultaneously with masking layer 38 and sometimes is just partially removed in which case the remaining dielectric ARC 36 is then removed.

A contact metal is formed over the structure, filling borderless contact hole 44. The excess of the contact metal is removed by a planarization process to leave planarized borderless contact 50 within borderless contact hole 44.

Borderless contact 50 is preferably comprised of copper, aluminum tungsten, or tungsten with Ti/TiN as a barrier layer and is more preferably comprised of tungsten with Ti/TiN as a barrier layer.

ADVANTAGES OF ONE OR MORE EMBODIMENTS OF THE PRESENT INVENTION

The advantages of one or more embodiments of the present invention include:

1. SiON has less reflectance than SiN which can provide a better photolithography window process;
2. SiON as stop layer has better device performance; and
3. high oxide to oxynitride selectivity with high throughput.

While particular embodiments of the present invention have been illustrated and described, it is not intended to limit the invention, except as defined by the following claims.

We claim:

1. A method of forming a borderless contact, comprising the steps of:

providing a substrate having an exposed conductive structure;

forming an oxynitride etch stop layer over the substrate and the exposed conductive structure;

forming an oxide dielectric layer over the oxynitride etch stop layer;

etching the oxide dielectric layer with an etch process wherein the oxide dielectric layer is etched at a greater rate than oxynitride etch stop layer to form a contact hole therein exposing a portion of the oxynitride etch stop layer over at least a portion of the exposed conductive structure; the etch process not etching the oxynitride etch stop layer and including:

a fluorine containing gas $C_xF_y$ selected from the group consisting of $C_4F_8$, $C_5F_8$, $C_4F_6$, $C_3F_8$ and $C_3F_6$;

an inert gas selected from the group consisting of Ar, He and Ne; and an oxidant selected from the group consisting of CO, $O_2$ and CO plus $O_2$;

wherein the etch process is conducted at the following parameters: a total pressure of from about 1 to 1000 mTorr; top and bottom RF power of each from about 500 to 5000 watts; a reactor temperature of from about −30 to 60° C.; a $C_xF_y$ gas flow of from about 5 to 50 sccm; a CO gas flow of from about 50 to 1000 sccm; an $O_2$ gas flow of from about 2 to 50 sccm; an Ar gas flow of from about 50 to 1000 sccm; and an He gas flow of from about 50 to 1000 sccm;

removing the exposed portion of the oxynitride etch stop layer over at least a portion of the conductive structure; and forming a borderless contact within the contact hole; the borderless contact in electrical connection with at least a portion of the conductive structure.

2. The method of claim 1, wherein the oxynitride etch stop layer is from about 100 to 1000 Å thick; and the oxide dielectric layer is from about 1000 to 10,000 Å thick.

3. The method of claim 1, wherein the oxynitride etch stop layer is from about 200 to 400 Å thick; and the oxide dielectric layer is from about 3000 to 6000 Å thick.

4. The method of claim 1, wherein the fluorine containing gas is selected from the group consisting of $C_4F_8$, $C_5F_8$ and $C_4F_6$; the inert gas is selected from the group consisting of Ar and He; and the oxidant is selected from the group consisting of CO, $O_2$.

5. The method of claim 1, wherein the fluorine containing gas is $C_5F_8$; the inert gas is Ar; and the oxidant is CO plus $O_2$.

6. The method of claim 1, wherein the oxynitride etch stop layer is silicon oxynitride; and the borderless contact is comprised of a material selected from the group consisting of copper, aluminum, tungsten and tungsten with a Ti/TiN barrier layer.

7. The method of claim 1, wherein the oxynitride etch stop layer is silicon oxynitride; and the borderless contact is comprised of tungsten with Ti/TiN as a barrier layer.

8. The method of claim 1, wherein the etch process is conducted in an oxide etcher selected from the group consisting of an RIE etcher, a MEIRE etcher, an ICP etcher and a CCP etcher.

9. The method of claim 1, wherein the oxide-to-oxynitride selectivity is from about 5:1 to 50:1.

10. The method of claim 1, wherein the oxide-to-oxynitride selectivity is from about 15:1 to 25:1.

11. The method of claim 1, wherein the oxide-to-oxynitride selectivity is achieved by the formation of a greater amount of carbon fluoride polymer plasma by-product over the exposed portion of the oxynitride etch stop layer within the contact hole than over the oxide dielectric layer within the contact hole.

12. The method of claim 1, wherein the $C_xF_y$ gas is a $C_5F_8$ gas.

13. A method of forming a borderless contact, comprising the steps of:

providing a substrate having an exposed conductive structure;

forming an oxynitride etch stop layer over the substrate and the exposed conductive structure;

forming a oxide dielectric layer over the oxynitride etch stop layer;

etching the oxide dielectric layer with an etch process wherein the oxide-to-oxynitride selectivity is from about 5:1 to 50:1 to form a contact hole therein exposing a portion of the oxynitride etch stop layer over at least a portion of the exposed conductive structure; the etch process not etching the oxynitride etch stop layer and including:

a fluorine containing gas selected from the group consisting of $C_4F_8$, $C_5F_8$, $C_4F_6$, $C_3F_8$ and $C_3F_8$;

an inert gas selected from the group consisting of Ar, He and Ne; and an oxidant selected from the group consisting of CO, $O_2$ and CO plus $O_2$;

wherein the etch process is conducted at the following parameters: a total pressure of from about 1 to 1000 mTorr; top and bottom RF power of each from about 500 to 5000 watts; a reactor temperature of from about −30 to 60° C.; a $C_5F_8$ gas flow of from about 5 to 50 sccm; a CO gas flow of from about 50 to 1000 sccm; an $O_2$ gas flow of from about 2 to 50 sccm; and an Ar gas flow of from about 50 to 1000 sccm;

removing the exposed portion of the oxynitride etch stop layer over at least a portion of the conductive structure; and forming a borderless contact within the contact hole; the borderless contact in electrical connection with at least a portion of the conductive structure.

14. The method of claim 13, wherein the oxynitride etch stop layer is from about 100 to 1000 Å thick; and the oxide dielectric layer is from about 1000 to 10,000 Åthick.

15. The method of claim 13, wherein the oxynitride etch stop layer is from about 200 to 400 Å thick; and the oxide dielectric layer is from about 3000 to 6000 Å thick.

16. The method of claim 13, wherein the oxynitride etch stop layer is silicon oxynitride; and the borderless contact is comprised of a material selected from the group consisting of copper, aluminum, tungsten and tungsten with a Ti/TiN barrier layer.

17. The method of claim 13, wherein the oxynitride etch stop layer is silicon oxynitride; and the borderless contact is comprised of tungsten with a Ti/TiN barrier layer.

18. The method of claim 13, wherein the etch process is conducted in an oxide etcher selected from the group consisting of an RIE etcher, a MEIRE etcher an ICP etcher and a CCP etcher.

19. The method of claim 13, wherein the oxide-to-oxynitride selectivity is from about 15:1 to 25:1.

20. The method of claim 13, wherein the oxide-to-oxynitride selectivity is achieved by the formation of a greater amount of carbon fluoride polymer plasma by-product over the exposed portion of the oxynitride etch stop layer within the contact hole than over the oxide dielectric layer within the contact hole.

21. The method of claim 13, wherein the etch process further includes an He gas flow of from about 50 to 1000 sccm.

22. A method of forming a borderless contact, comprising the steps of:

providing a substrate having an exposed conductive structure;

forming an oxynitride etch stop layer over the substrate and the exposed conductive structure;

forming a oxide dielectric layer over the oxynitride etch stop layer;

forming a patterned masking layer over the oxide dielectric layer;

etching the oxide dielectric layer using the patterned masking layer as a mask with an etch process wherein the oxide-to-oxynitride selectivity is from about 5:1 to 50:1 to form a contact hole therein exposing a portion of the oxynitride etch stop layer over at least a portion of the exposed conductive structure; the etch process not etching the oxynitride etch stop layer and including:

a fluorine containing gas $C_xF_y$ selected from the group consisting of $C_4F_8$, $C_5F_8$, $C_4F_6$, $C_3F_8$ and $C_3F_6$;

an inert gas selected from the group consisting of Ar, He and Ne; and an oxidant selected from the group consisting of CO, $O_2$ and CO plus $O_2$;

wherein the etch process is conducted at the following parameters: a total pressure of from about 1 to 1000 mTorr; top and bottom RF power of each from about 500 to 5000 watts; a reactor temperature of from about −30 to 60° C.; a $C_xF_y$ gas flow of from about 5 to 50 sccm; a CO gas flow of from about 50 to 1000 sccm; an $O_2$ gas flow of from about 2 to 50 sccm; an Ar gas flow of from about 50 to 1000 sccm;

removing the patterned masking layer;

removing the exposed portion of the oxynitride etch stop layer over at least a portion of the conductive structure; and forming a borderless contact within the contact hole; the borderless contact in electrical connection with at least a portion of the conductive structure.

23. The method of claim 22, wherein the oxynitride etch stop layer is from about 100 to 1000 Å thick; and the oxide dielectric layer is from about 1000 to 10,000 Å thick.

24. The method of claim 22, wherein the oxynitride etch stop layer is from about 200 to 400 Å thick; and the oxide dielectric layer is from about 3000 to 6000 Å thick.

25. The method of claim 22, wherein the fluorine containing gas is selected from the group consisting of $C_4F_8$, $C_5F_8$ and $C_4F_6$; the inert gas is selected from the group consisting of Ar and He; and the oxidant is selected from the group consisting of CO and $O_2$.

26. The method of claim 22, wherein the fluorine containing gas is $C_5F_8$; the inert gas is Ar; and the oxidant is CO plus $O_2$.

27. The method of claim 22, wherein the oxynitride etch stop layer is silicon oxynitride; the patterned masking layer is comprised of a material selected from the group consisting of photoresist and photoresist plus Si-containing polymer; and the borderless contact is comprised of a material selected from the group consisting of copper, aluminum, tungsten, and tungsten with a Ti/TiN barrier layer.

28. The method of claim 22, wherein the oxynitride etch stop layer is silicon oxynitride; the patterned masking layer is comprised of photoresist; and the borderless contact is comprised of tungsten with a Ti/TiN barrier layer.

29. The method of claim 22, wherein the etch process is conducted in an oxide etcher selected from the group consisting of an RIE etcher, a MEIRE etcher, an ICP etcher and a CCP etcher.

30. The method of claim 22, wherein the oxide-to-oxynitride selectivity is from about 15:1 to 25:1.

31. the method of claim 22, wherein the oxide-to-oxynitride selectivity is achieved by the formation of a greater amount of carbon fluoride polymer plasma by-product over the exposed portion of the oxynitride etch stop layer within the contact hole than over the oxide dielectric layer within the contact hole.

32. The method of claim 22, wherein the etch process further includes an He gas flow of from about 50 to 1000 sccm.

33. The method of claim 22, wherein the $C_xF_y$ gas comprises a $C_5F_8$ gas.

* * * * *